(12) United States Patent
Nomura et al.

(10) Patent No.: US 9,734,061 B2
(45) Date of Patent: Aug. 15, 2017

(54) MEMORY CONTROL CIRCUIT AND PROCESSOR

(71) Applicant: Kabushiki Kaisha Toshiba, Tokyo (JP)

(72) Inventors: Kumiko Nomura, Tokyo (JP); Shinobu Fujita, Tokyo (JP); Keiko Abe, Kanagawa (JP); Kazutaka Ikegami, Kanagawa (JP); Hiroki Noguchi, Kanagawa (JP); Susumu Takeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 14/994,900

(22) Filed: Jan. 13, 2016

(65) Prior Publication Data
US 2016/0132430 A1 May 12, 2016

Related U.S. Application Data

(63) Continuation of application No. PCT/JP2014/068923, filed on Jul. 16, 2014.

(30) Foreign Application Priority Data

Jul. 16, 2013 (JP) ................................ 2013-147508

(51) Int. Cl.
*G06F 12/08* (2016.01)
*G06F 12/0802* (2016.01)
(Continued)

(52) U.S. Cl.
CPC ............ *G06F 12/0802* (2013.01); *G06F 1/26* (2013.01); *G06F 1/32* (2013.01); *G06F 12/0897* (2013.01);
(Continued)

(58) Field of Classification Search
CPC .......... G06F 12/0802; G06F 1/26; G06F 1/32; G06F 12/0897; G11C 11/1697
(Continued)

(56) References Cited

U.S. PATENT DOCUMENTS 5,761,715 A * 6/1998 Takahashi ............. G06F 1/3215
365/227
6,983,388 B2 * 1/2006 Kaxiras ................. G11C 11/417
711/145
(Continued)

FOREIGN PATENT DOCUMENTS

JP 2002-182980 6/2002
JP 2009-211153 9/2009
(Continued)

OTHER PUBLICATIONS

International Search Report from the Japanese Patent Office for International Application No. PCT/JP2014/068923 mailed Sep. 4, 2014.
(Continued)

*Primary Examiner* — Stephen Elmore
(74) *Attorney, Agent, or Firm* — Finnegan, Henderson, Farabow, Garrett & Dunner, L.L.P.

(57) ABSTRACT

A memory control circuit has a request determination circuitry to determine whether a period without read-out request and write request to an i-th (i being an integer of 1 or more and of n or less, n being an integer of 2 or more) level cache memory among first to n-th level cache memories continues for a first period of time or longer, the i-th level cache memory comprising a first nonvolatile memory, and a power-supply controller to control a power cut-off timing to the i-th level cache memory based on a determination of the request determination circuitry.

20 Claims, 16 Drawing Sheets

(51) Int. Cl.
  *G06F 1/26* (2006.01)
  *G06F 1/32* (2006.01)
  *G06F 12/0897* (2016.01)
  *G11C 11/16* (2006.01)

(52) U.S. Cl.
  CPC .. *G11C 11/1697* (2013.01); *G06F 2212/1028* (2013.01); *G06F 2212/222* (2013.01); *G06F 2212/60* (2013.01); *G06F 2212/601* (2013.01); *Y02B 60/1225* (2013.01)

(58) Field of Classification Search
  USPC ............ 711/119, 103, 118, 122, 154, 158; 713/320, 322, 324, 330
  See application file for complete search history.

(56) References Cited

U.S. PATENT DOCUMENTS

| | | | | |
|---|---|---|---|---|
| 7,380,063 | B2* | 5/2008 | Horrigan | G06F 12/0804 710/262 |
| 7,941,683 | B2* | 5/2011 | Branover | G06F 1/3225 713/320 |
| 8,117,478 | B2* | 2/2012 | Liu | G06F 1/206 713/300 |
| 8,195,887 | B2* | 6/2012 | Hughes | G06F 1/3203 711/135 |
| 8,271,728 | B2* | 9/2012 | Strumper | G06F 12/0897 711/118 |
| 8,285,924 | B1* | 10/2012 | Cohn | G06F 1/3215 711/113 |
| 8,347,119 | B2 | 1/2013 | Song | |
| 8,412,970 | B2* | 4/2013 | Liu | G06F 1/206 713/300 |
| 8,473,766 | B2* | 6/2013 | Liu | G06F 1/206 713/300 |
| 8,700,933 | B2* | 4/2014 | Liu | G06F 1/206 713/300 |
| 8,892,924 | B2* | 11/2014 | Balasubramanian | G06F 1/3237 713/323 |
| 8,892,929 | B2* | 11/2014 | Balasubramanian | G06F 1/3237 713/323 |
| 8,984,227 | B2* | 3/2015 | Shiu | G06F 1/3275 711/128 |
| 9,003,128 | B2 | 4/2015 | Nomura et al. | |
| 9,557,801 | B2* | 1/2017 | Nomura | G06F 1/3275 |
| 2009/0222620 | A1 | 9/2009 | Kanai | |
| 2011/0283124 | A1 | 11/2011 | Branover et al. | |
| 2012/0233377 | A1 | 9/2012 | Nomura et al. | |
| 2013/0028012 | A1 | 1/2013 | Fujita et al. | |
| 2013/0031397 | A1 | 1/2013 | Abe et al. | |
| 2013/0139007 | A1 | 5/2013 | Higo et al. | |

FOREIGN PATENT DOCUMENTS

| | | |
|---|---|---|
| JP | 2012-190359 | 10/2012 |
| JP | 2012-203487 | 10/2012 |
| JP | 2013-30024 | 2/2013 |
| JP | 2013-30249 | 2/2013 |
| JP | 2013-114441 | 6/2013 |
| JP | 2013-526739 | 6/2013 |

OTHER PUBLICATIONS

K. Momura et al., "Run-time Normally-off Processor with Magnetic-cache based on Ultra-Low-Power-STT-MRAM", The 25$^{th}$ Workshop on Circuits and Systems in Awaji, pp. 301-306 (2012).
International Search Report from the Japanese Patent Office for International Application No. PCT/JP2014/068923 dated Sep. 4, 2014.

* cited by examiner

FIG. 6A

| STATE | POWER CUT SECTION | | | |
|---|---|---|---|---|
| C0-state | | | | |
| H-state | | | | |
| C1/C2-state | Clock | | | |
| C3-state | Clock | PLL | L1-CACHE | |
| C4-state | Clock | PLL | L1-CACHE | L2-CACHE |
| | | | | L2-CACHE |
| | | | | L2-CACHE |
| | | | | L2-CACHE |
| | | | | ANOTHER SECTION |

FIG. 6B

| STATE | POWER CUT SECTION | | | |
|---|---|---|---|---|
| C0-state | | | | |
| C1/C2-state | Clock | | | |
| H-state | Clock | | | |
| C3-state | Clock | PLL | L1-CACHE | L2-CACHE |
| C4-state | Clock | PLL | L1-CACHE | L2-CACHE |
| | | | | L2-CACHE |
| | | | | ANOTHER SECTION |

FIG. 8A

| STATE | POWER CUT SECTION | | | |
|---|---|---|---|---|
| C0-state | Clock | | | |
| H1-state | Clock | | PLL | L2-PERIPHERAL CIRCUIT UNIT |
| H2-state | Clock | | PLL | L2-CACHE (POWER CUT TO LOGIC UNIT) |
| C1/C2-state | | | | |
| C3-state | Clock | | PLL | L2-CACHE |
| C4-state | Clock | L1-CACHE | PLL | L2-CACHE |
| | | L1-CACHE | | L2-CACHE / ANOTHER SECTION |

FIG. 8B

| STATE | POWER CUT SECTION | | | |
|---|---|---|---|---|
| C0-state | Clock | | | |
| C1/C2-state | | | | |
| H1-state | Clock | | | L2-PERIPHERAL CIRCUIT UNIT |
| H2-state | Clock | | | L2-CACHE (POWER CUT TO LOGIC UNIT) |
| C3-state | Clock | | PLL | L2-CACHE |
| C4-state | Clock | L1-CACHE | PLL | L2-CACHE |
| | | L1-CACHE | | L2-CACHE / ANOTHER SECTION |

FIG. 10A

| STATE | | | POWER CUT SECTION | | | |
|---|---|---|---|---|---|---|
| C0-state | | | | | | |
| H1-state | | | | CLOCK UNIT IN CACHE OF HIGHER LEVEL THAN L2-CACHE | | |
| H2-state | | | | L2-PERIPHERAL CIRCUIT UNIT | | |
| H3-state | | | | L2-CACHE (POWER CUT TO LOGIC UNIT) | | |
| C1/C2-state | Clock | | | | | |
| C3-state | Clock | PLL | L1-CACHE | L2-CACHE | L2-CACHE | |
| C4-state | Clock | PLL | L1-CACHE | L2-CACHE | L2-CACHE | ANOTHER SECTION |

FIG. 10B

| STATE | | | POWER CUT SECTION | | | |
|---|---|---|---|---|---|---|
| C0-state | | | | | | |
| C1/C2-state | Clock | | | L2-CACHE | | |
| H1-state | Clock | | | CLOCK UNIT IN CACHE OF HIGHER LEVEL THAN L2-CACHE | | |
| H2-state | Clock | | | L2-PERIPHERAL CIRCUIT UNIT | | |
| H3-state | Clock | | | L2-CACHE (POWER CUT TO LOGIC UNIT) | | |
| C3-state | Clock | PLL | L1-CACHE | L2-CACHE | L2-CACHE | |
| C4-state | Clock | PLL | L1-CACHE | L2-CACHE | L2-CACHE | ANOTHER SECTION |

MEMORY CONTROL CIRCUIT AND PROCESSOR

CROSS-REFERENCE TO RELATED APPLICATIONS

This application is based upon and claims the benefit of priority from Japanese Patent Application NO. 2013-147508, filed on Jul. 16, 2013, the entire contents of which are incorporated herein by reference.

FIELD

Embodiments of the present invention relate to a memory control circuit for controlling cache memories and a processor.

BACKGROUND

In recent years, lower power consumption has become a very important issue for processor systems. Generally, volatile memories are used for cache memories of currently used processor systems. It is a problem for this type of processor system that data on cache memories vanish when power supply to the cache memories is cut off while the processor system is in operation. Therefore, when there is a data request, it is required to read out data from a higher level memory than the cache memories, which causes a longer reading time, leading to performance degradation. Because of this, power has to be continuously supplied to the entire processor system including the cache memories while a core of the processor system is in operation.

The standby power consumption of non-volatile memories is lower than that of volatile memories. Therefore, the non-volatile memories may be used as secondary or higher-level cache memories of a processor for further lower power consumption. Cache memories using non-volatile memories have a feature of an extremely short recovery time compared to volatile memories because the non-volatile memories do not lose data even if power is down. The access interval is long for especially the secondary or higher-level cache memories even if the processor is in operation. Therefore, the secondary or higher-level cache memories have many non-operating periods. However, the conventional processor systems perform power control based on power management by an operating system, and hence the processor cannot perform power management only for the cache memories based on judgment of the processor while the processor is in operation.

BRIEF DESCRIPTION OF THE DRAWINGS

FIG. 6A and FIG. 6B are illustrations showing the correspondence between operation conditions and power cut-off units of the processor 2 according to the first embodiment;

FIG. 8A and FIG. 8B are illustrations showing the correspondence between operation conditions and power cut-off units of a processor 2 according to the second embodiment;

FIG. 10A and FIG. 10B are illustrations showing the correspondence between operation conditions and power cut-off units of a processor 2 according to the third embodiment;

DETAILED DESCRIPTION

A memory control circuit according to one embodiment has a request determination circuitry to determine whether a period without read-out request and write request to an i-th (i being an integer of 1 or more and of n or less, n being an integer of 2 or more) level cache memory among first to n-th level cache memories continues for a first period of time or longer, the i-th level cache memory comprising a first non-volatile memory, and a power-supply controller to control a power cut-off timing to the i-th level cache memory based on a determination of the request determination circuitry.

Embodiments will now be explained with reference to the accompanying drawings.

First Embodiment

Figure 1:
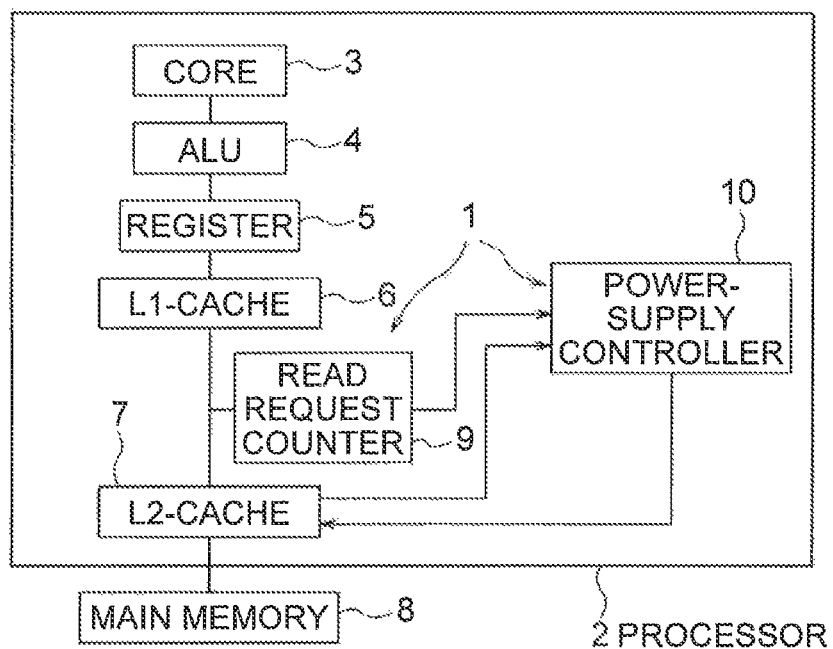
FIG. 1 is a block diagram schematically showing schematic configuration of a processor 2 having a memory control circuit 1 according to a first embodiment.

FIG. 1 is a block diagram schematically showing schematic configuration of a processor 2 having a memory control circuit 1 according to a first embodiment. The processor 2 of FIG. 1 is provided with a core 3 for executing a given command, an arithmetic logic unit (arithmetic circuitry) (ALU) 4 for performing arithmetic logic operations under instructions from the core 3, a register 5, an L1-cache 6, an L2-cache 7, and a memory control circuit 1 for controlling accesses to the L1-cache 6 under instructions from the core 3 and the ALU 4.

The L1-cache 6 is a small-capacity, high-speed cache memory and usually includes SRAMs (Static RAMs). The L2-cache 7 is a cache memory having a larger capacity than the L1-cache 6. The present embodiment is explained with an example in which the L2-cache 7 includes non-volatile memories such as MRAMs (Magnetoresistive RAM). The L1-cache 6 and a main memory 8 may include conventional volatile memories or non-volatile memories.

Data to be frequently accessed by the core 3 of the processor 2 are stored in the L1-cache 6 at high priority while data that cannot be stored in the L1-cache 6 are stored in the L2-cache 7. The data stored in the L1-cache 6 and L2-cache 7 is finally written back to the main memory 8.

At least either the L1-cache 6 or the L2-cache 7 may be embedded in the processor 2 or externally attached to the processor 2. Although, a cache memory of higher level than the L2-cache 7 may be provided, it is omitted from FIG. 1.

The memory control circuit 1 has a read request counter 9 and a power-supply controller (power-supply control circuitry) 10. The read request counter 9 counts up when a read request from the L1-cache 6 reaches the L2-cache 7. The read request counter 9 counts down when data is transferred to the L1-cache 6 from the L2-cache 7 in response to this request. The power-supply controller 10 controls power supply to the L2-cache 7 to supply or cut off the power thereto based on a count value of the read request counter 9 and on whether there is a write request to the L2-cache 7.

Figure 2:
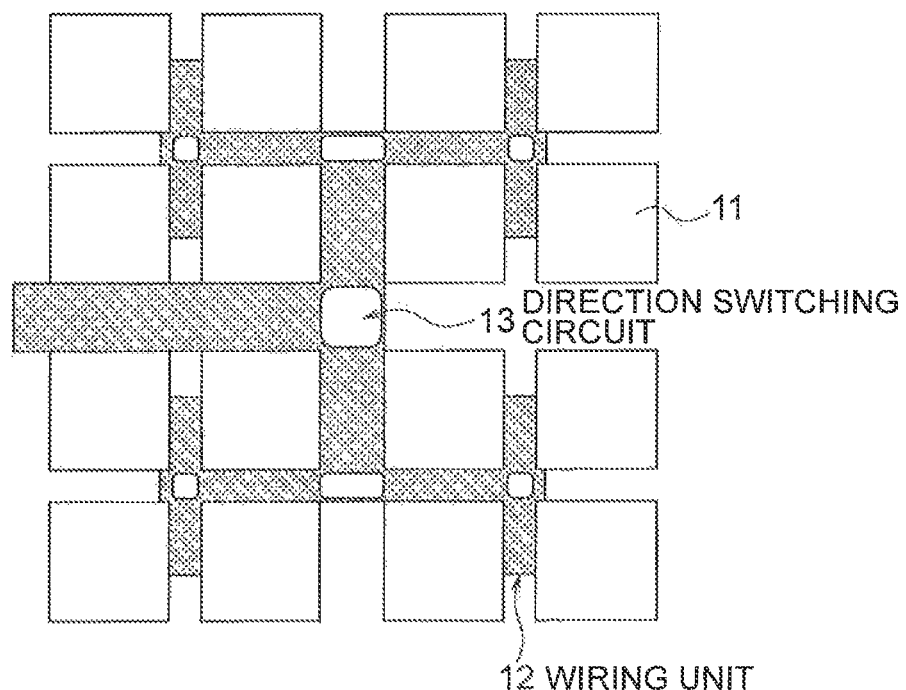
FIG. 2 is an illustration schematically showing configuration of an L2-cache 7 equipped with non-volatile memories.

FIG. 2 is an illustration schematically showing the configuration of the L2-cache 7 equipped with non-volatile memories. As shown in FIG. 2, the L2-cache 7 has a plurality of sub-arrays 11 arranged laterally and orthogonally, each having a plurality of memory cells. A wiring unit (wiring circuitry) 12 that includes word lines, bit lines, control lines, clock lines, power supply lines, etc., and a plurality of direction switching circuit 13 that select any one of the sub-arrays 11 are provided among the sub-arrays 11.

Figure 3:
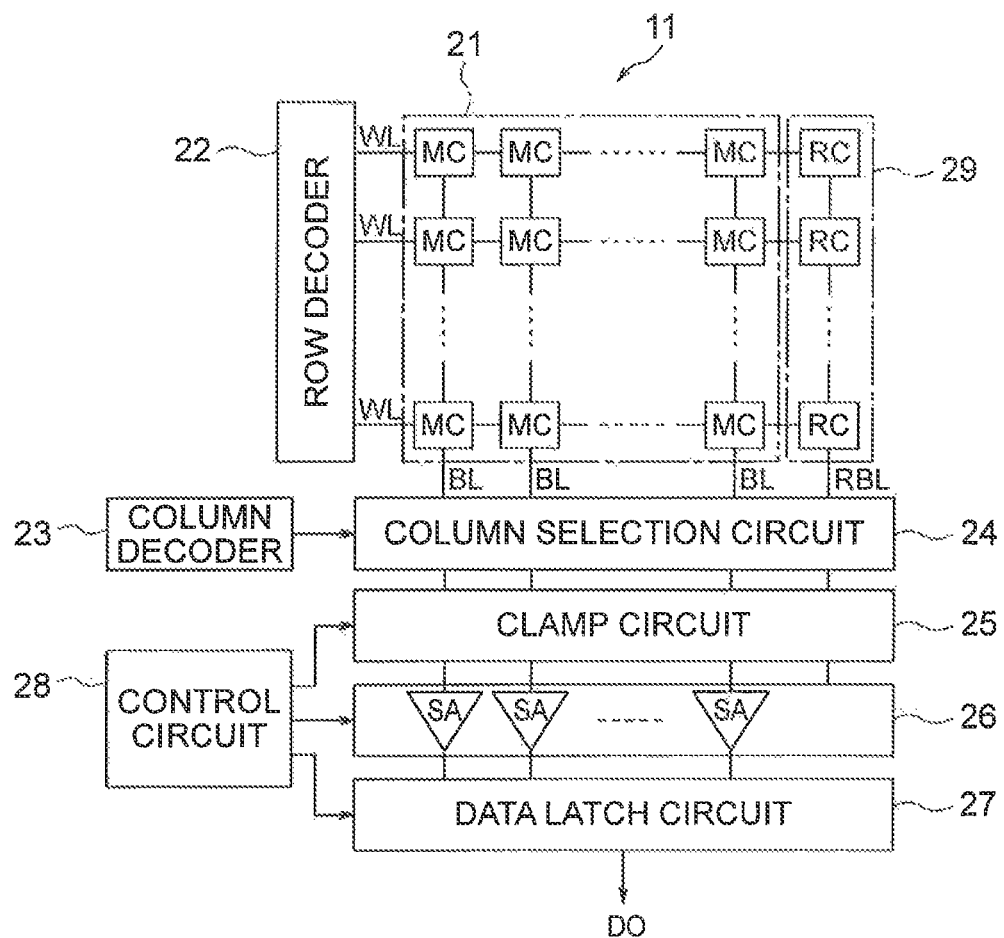
FIG. 3 is a block diagram showing one example of the internal configuration of each sub-array 11.

FIG. 3 is a block diagram showing one example of the internal configuration of each sub-array 11. Each sub-array 11 has a cell array 21 provided with a plurality of memory cells, a row decoder 22, a column decoder 23, a column selection circuit 24, a clamp circuit 25, a sense amplifier 26, a data latch circuit 27, a control circuit 28, and a redundant-cell group 29. The row decoder 22 selects any one of the word lines based on an externally supplied row address. The column decoder 23 and the column selection circuit 24 each select any one of the bit lines based on an externally supplied column address. The clamp circuit 25 suppresses a voltage amplitude of bit line data. The sense amplifier 26 performs gain adjustments to the output signal of the clamp circuit 25. The data latch circuit 27 latches the output signal of the sense amplifier 26 at a specific timing. The redundant-cell group 29 has a plurality of redundant cells with which memory cells of the cell array 21 are replaced when the memory cells become defective.

Figure 4A:
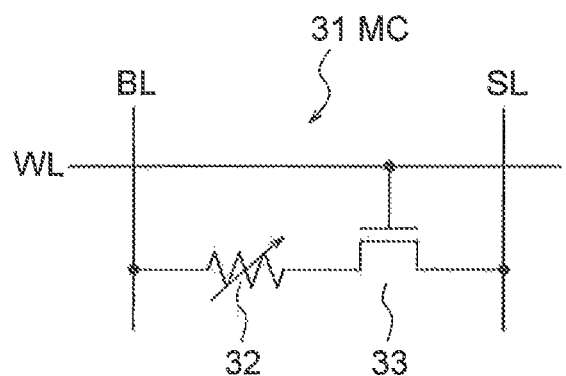
FIG. 4A is a diagram showing one example of the circuit configuration of an MRAM cell 31 and FIG. 4B is a view showing a cross-sectional structure of a magnetoresistive element 32.

The memory cells of the cell array 21 are non-volatile memory cells, for example, MRAM cells. FIG. 4A is a diagram showing one example of the circuit configuration of an MRAM cell 31. As shown, the MRAM cell 31 has a magnetoresistive element 32 and a transistor 33. The resistance of the magnetoresistive element 32 varies drastically depending on a current flowing direction. Thus, this change in resistance is utilized in data recording of 0 or 1.

Figure 4B:
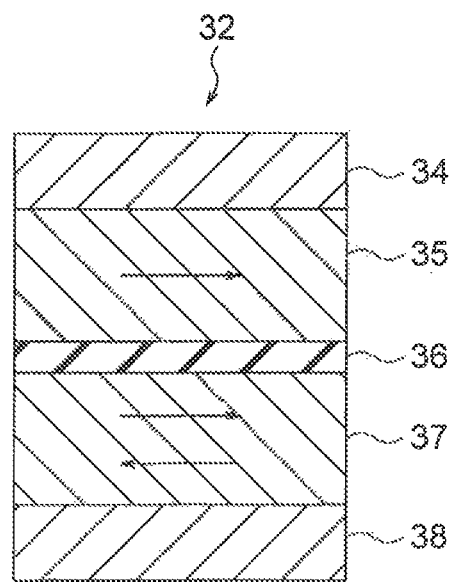

FIG. 4B is a view showing a cross-sectional structure of the magnetoresistive element 32. The magnetoresistive element 32 has a nonmagnetic layer 34, a reference layer 35, a tunnel barrier layer 36, a recording layer 37, and a base layer 38 from the top to bottom in FIG. 4B. The magnetization direction of the reference layer 35 is a fixed direction parallel to the film surface. In contrast, the magnetization direction of the recording layer 37 varies in parallel to the film surface. However, the reference layer 35 and the recording layer 37 may be made of a material that is magnetized in a direction orthogonal to the film surface. If the magnetization direction of reference layer 35 and the recording layer 37 is orthogonal to the film surface, the magnetoresistive element 32 is called a perpendicular-magnetic tunnel junction device (p-MTJ). This p-MTJ can be written with lower power. Especially, the MRAM 32 using low-power writable p-MTJ devices is called perpendicular spin-transfer torque MRAM (STT-MRAM).

Figure 5:
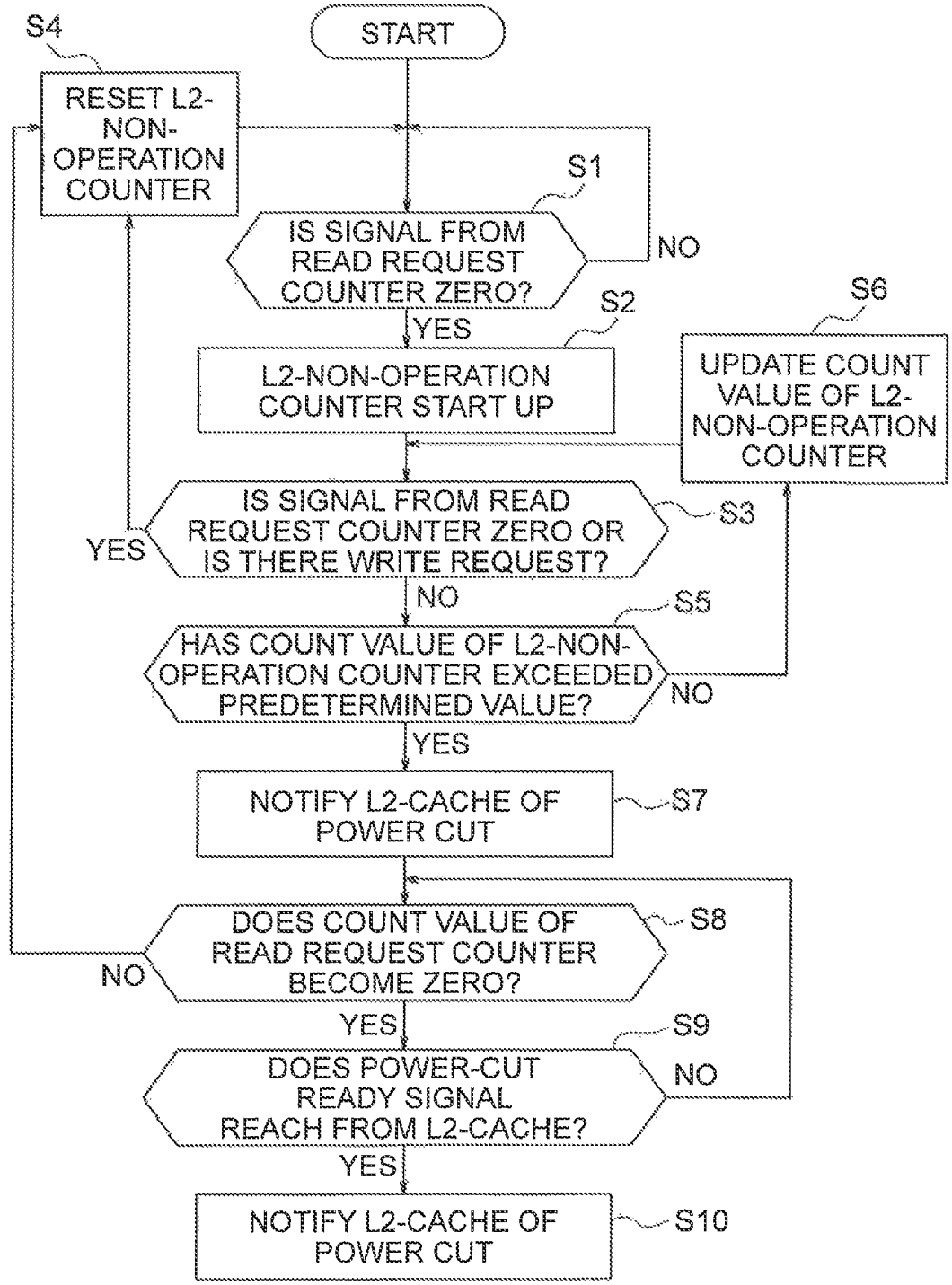
FIG. 5 is a flowchart showing one example of an operation of a power-supply controller 10.

FIG. 5 is a flowchart showing one example of an operation of the power-supply controller 10. It is determined whether the count value of the read request counter 9 is zero or not (step S1). When the count value of the read request counter 9 is zero, it means that there is no read request from the L1-cache 6 and there is no corresponding process not executed yet.

The operation remains in step S1 until the count value of the read request counter 9 becomes zero. When the count value becomes zero, an L2-non-operation counter in the power-supply controller 10 starts up (step S2). The L2-non-operation counter is a counter that measures a period in which there is no access to the L2-cache 7 continuously. The L2-non-operation counter is embedded in the power-supply controller 10, for example. After the start-up, the L2-non-operation counter counts up, for example, in synchronism with system clocks.

Next, it is determined whether the count value of the read request counter 9 becomes zero or there is a write request from the L1-cache 6 to the L2-cache 7 (step S3). If YES in the determination of step S3, the L2-non-operation counter is reset (step S4) and the operation returns to step S1.

If NO in the determination of step S3, it is determined whether the count value of the L2-non-operation counter has exceeded a predetermined value (step S5). If the count value has not exceeded the predetermined value, the power-supply controller 10 counts up (updates) the count value of the L2-non-operation counter (step S6) and the operation returns to step S3. If the count value has exceeded the predetermined value, the power-supply controller 10 notifies the L2-cache 7 of power cut-off (step S7).

Next, it is determined whether the count value of the read request counter 9 becomes zero or not (step S8). If the count value is not zero, the operation returns to step S4 to reset the L2-non-operation counter, and then step S1 and the following steps are executed. If the count value is zero, it is determined whether a power-cut-off ready signal reaches from the L2-cache 7 (step S9). The operation remains in step S9 until the power-cut-off ready signal reaches. When the power-cut-off ready signal has reached, the power-supply controller 10 instructs the L2-cache 7 to cut off power (step S10).

When there is a read or write request from the L1-cache 6 to the L2-cache 7 after the notification of power cut-off to the L2-cache 7 in step S10, the power-supply controller 10 performs a process of power recovery to the L2-cache 7. In the flowchart of FIG. 5, step S5 corresponds to a request determination unit (request determination circuitry).

The flowchart of FIG. 5 is an example in which the power-supply controller 10 controls power cut-off to the L2-cache 7 of non-volatile memories. Power cut-off can also be controlled to cache memories of higher level than the L2-cache 7 in the same process as that shown in FIG. 5. For example, it is supposed that power cut-off is controlled to a cache memory of n (n being an integer of 2 or more)-th-level non-volatile memories. In this case, the read request counter 9 counts up when there is a read request from a (n-1)-th-level cache memory to the n-th-level cache memory. When the n-th-level cache memory responds to this request of the (n-1)-th-level cache memory, the read request counter 9 counts down.

FIG. 6 is an illustration showing the correspondence between operation conditions and power cut-off units (power cut-off circuitry) of the processor 2 according to the first embodiment. A C0-state is a state in which the processor 2 is always supplied with power. An H-state is a state in which power supply to the L2-cache 7 is cut off in accordance with the process of FIG. 5 described above. In the H-state, power cut-off may be performed not only to the L2-cache 7 but also to each non-volatile memory of cache memories of higher level than the L2-cache 7 and the main memory 8 in accordance with the same process as that shown in FIG. 5.

A C1/C2-state is a state in which, in addition to power cut-off to the L2-cache 7, power supply to a block that generates a clock signal of the processor 2 is cut off. A C3-state is a state in which power supply to a PLL circuit used for generating a clock signal and to the L1-cache 6 is further cut off. A C4-state is a state in which power supply to the other circuit blocks is cut off. By newly providing the H-state as shown in FIG. 6A, power supply to the L2-cache 7 can be cut off before the operating system starts a power control process. The operating system usually starts power control in a C1-state. However, by providing the H-state after the C1/C2-state as shown in FIG. 6B, power supply to the L2-cache 7 can be cut off during the power control process by the operating system irrespective of instructions of the operating system.

As described above, according to the first embodiment, the read request counter 9 and the power-supply controller 10 are embedded in the processor 2. The read request counter 9 performs a count process concerning the read request from the L1-cache 6 to the L2-cache 7 of non-volatile memories and the corresponding response process. The power-supply controller 10 controls power cut-off to the L2-cache 7 based on the count value of the read request counter 9 and the write request from the L1-cache 6 to the L2-cache 7. By this power control, power supply to the L2-cache 7 can be cut off as early as possible so that the processor 2 does not have any problems in operation, and hence power consumption of the processor 2 can be effectively reduced.

Especially, according to the present embodiment, before the start of power management by the operating system, or irrespective of a power management process by the operating system, power cut-off can be controlled to the hardware in the processor 2. In detail, it is possible to control the power cut-off of the cache memory of non-volatile memories by the read request counter 9 and the power-supply controller 10. Therefore, the power consumption of the processor 2 can be reduced without depending on the operating system.

In addition, also for an L3-cache and other cache memories of higher level than L3-cache, each having non-volatile memories, power cut-off can be controlled by the read request counter 9 and the power-supply controller 10 in the same process as that shown in FIG. 5. The process unique to the present embodiment is generalized as follows. The request determination unit that performs step S5 in FIG. 5 determines whether a period without read-out request and write request to an i-th (i being an integer of 1 or more and of n or less, n being an integer of 2 or more) level cache memory among first to n-th level cache memories continues for a predetermined period of time or longer, the i-th level cache memory comprising a non-volatile memory. And, a power-supply control circuitry that corresponds to the power-supply controller 10 controls a power cut-off timing to the above specific cache memory based on a determination result of the request determination unit.

Second Embodiment

A second embodiment which will be described below performs power cut-off control to the L2-cache 7 more finely than the first embodiment. The internal configuration of a processor 2 according to the second embodiment is the same as that shown FIG. 1 and thus the detailed explanation will be omitted.

Figure 7:
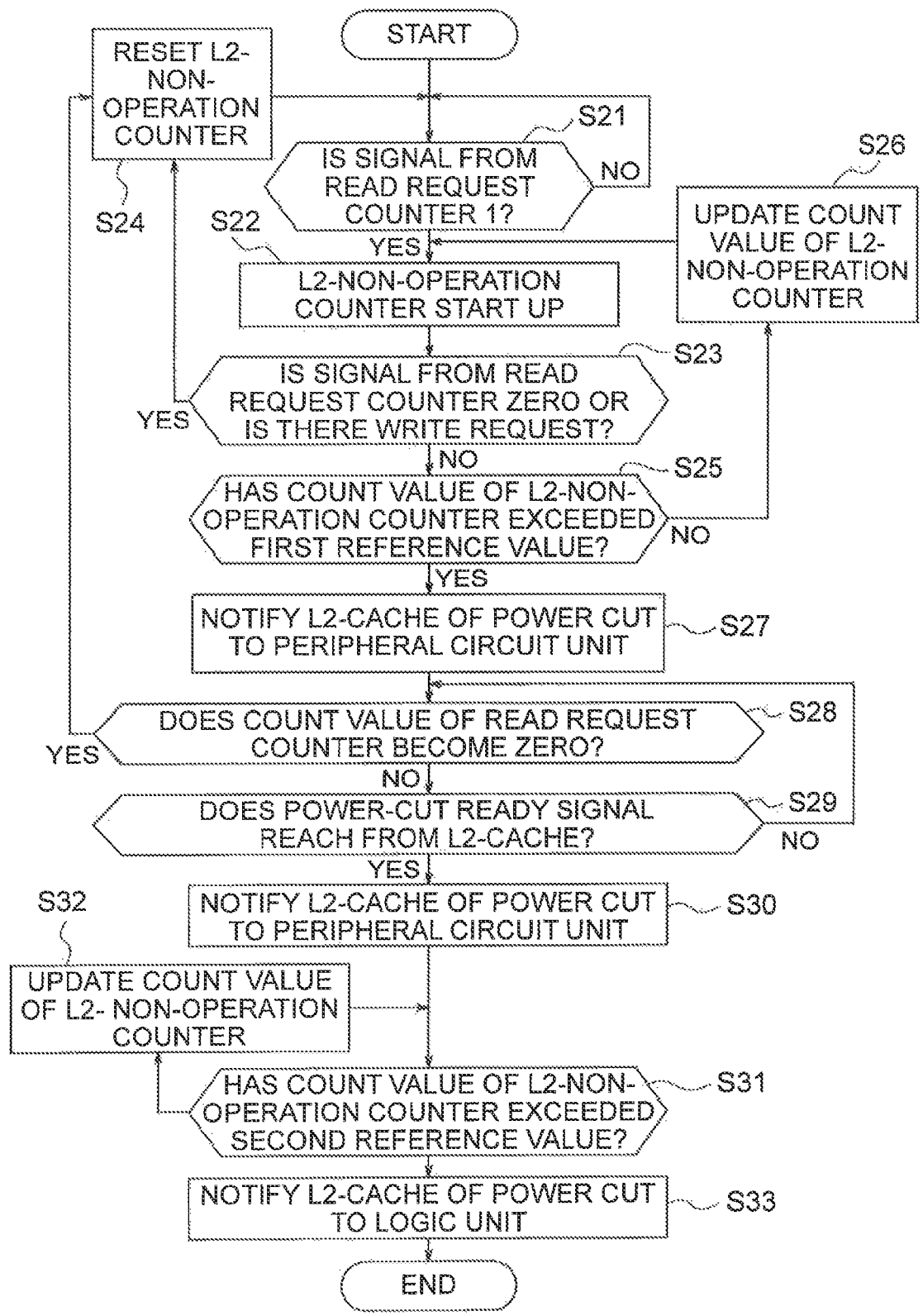
FIG. 7 is a flowchart showing an operation of a power-supply controller 10 according to a second embodiment.

FIG. 7 is a flowchart showing an operation of a power-supply controller 10 according to the second embodiment. In steps S21 to S26, like steps S1 to S6 in FIG. 5, it is determined whether the count value of the L2-non-operation counter has exceeded a predetermined first reference value (step S25). If the count value of the L2-non-operation counter has exceeded the first reference value, the power-supply controller 10 notifies the L2-cache 7 to cut off power supply to a peripheral circuitry of the L2-cache 7 (step S27).

As described above, according to the second embodiment, the L2-cache 7 is divided into a peripheral circuitry and a logic unit (logic circuitry), and power supply to the peripheral circuitry is cut off firstly. The peripheral circuitry is, for example, each circuit block in the sub-array 11 shown in FIG. 3.

The first reference value in step S25 is set, for example, to a lower value than the predetermined value in step S5 of FIG. 5. Therefore, it is possible to accelerate a timing of notifying the power-cut-off of the L2 cache 7 in step S27, compared with the first embodiment.

Next, it is determined whether the count value of the read request counter 9 becomes zero or not (step S28). If the count value is not zero, it is determined whether a power-cut-off ready signal has reached from the L2-cache 7 (step S29). If the power-cut-off ready signal has not reached yet, the operation returns to step S28. If the power-cut-off ready signal has reached, the power-supply controller 10 instructs the L2-cache 7 to cut off power supply to its peripheral circuitry (step S30).

Next, it is determined whether the count value of the L2-non-operation counter has exceeded a predetermined second reference value (step S31). If the count value has not exceeded the second reference value, the power-supply controller 10 updates the count value of the L2-non-operation counter (step S32) and the operation returns to step S31. If the count value has exceeded the second reference value, the power-supply controller 10 instructs the L2-cache 7 to cut off power supply to the logic unit (step S33). Through these steps, power supply to the entire L2-non-operation counter can be cut off.

The logic unit of the L2-cache 7 is a circuit portion of the L2-cache 7 other than the peripheral circuitry. The logic unit is, for example, the direction switching circuit 13 located between the sub-arrays 11, an I/O unit or I/O circuitry (not shown), etc. in FIG. 2. Moreover, at least a part of the sub-array 11 in FIG. 3, for example, the row decoder 22, the column decoder 23, and the control circuit 28 may be included in the logic unit and may be cut off from power supply in step S33. As described above, the configuration of the L2-cache 7 can be modified in any way as to how to divide the internal configuration of the L2-cache 7 into the peripheral circuitry and the logic unit.

In the flowchart of FIG. 7, steps S25 and S31 correspond to the request determination unit.

FIG. 8A and FIG. 8B are drawings showing the correspondence between operation conditions and power cut-off units of a processor 2 according to the second embodiment. FIG. 8A and FIG. 8B show an H1-state and an H2-state instated of the H-state of FIG. 6A and FIG. 6B. In the H1-state that follows a C0-state in FIG. 8A, power supply to the peripheral circuitry of the L2-cache 7 is cut off, and in the H2-state that follows the H1-state, power supply to the entire L2-cache 7 is cut off, including the logic unit. The circuitries to be cut off from power supply in the following C1- to C4-states are the same as those shown in FIG. 6A. In FIG. 8B, the H1-state and the H2-state follow the C1/C2-state, the other states are the same as those shown in FIG. 6B.

As described above, according to the second embodiment, the L2-cache 7 is divided into the peripheral circuitry and the logic unit which are cut off from power supply at different timings. Therefore, it is possible to accelerate a timing of starting the power cut-off to a part of the L2-cache 7, compared with the first embodiment, and hence power consumption can further be reduced.

In the second embodiment described above, one example has been explained in which power-cut-off control is performed by dividing the L2 cache 7 into the peripheral circuitry and the logic unit. Even in a higher level cache memory of a non-volatile memory than the L2 cache 2, the power cut-off control may be performed at different timings in the peripheral circuitry and the logic unit obtained by dividing each cache memory in accordance with the same process as that shown in FIG. 7.

Third Embodiment

A third embodiment which will be described below performs power cut-off control to the L2-cache 7 more finely than the second embodiment. The internal configuration of a processor 2 according to the third embodiment is the same as that shown FIG. 1, and thus the detailed explanation will be omitted.

Figure 9A:
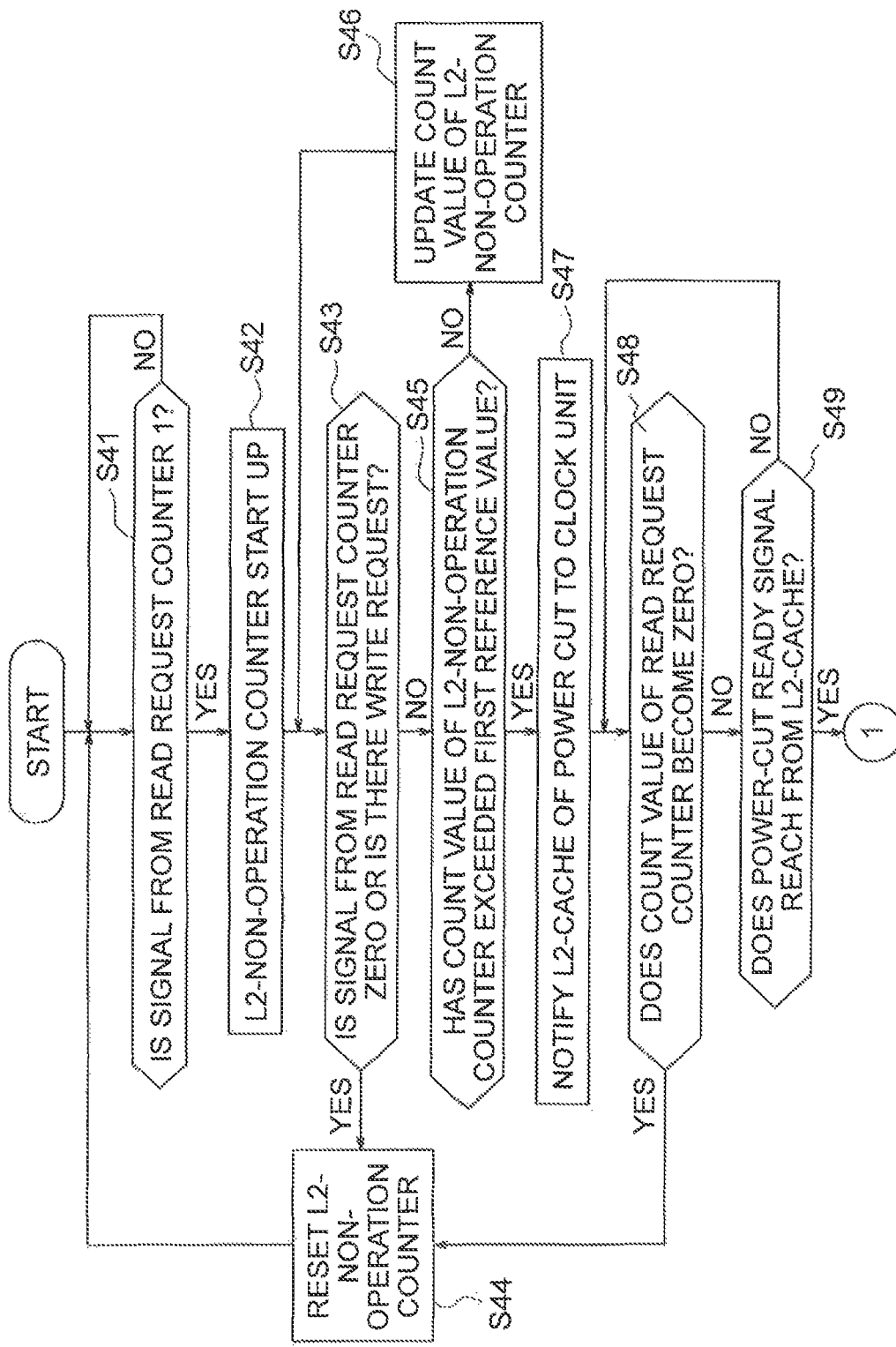
FIG. 9A is a flowchart showing an operation of a power-supply controller 10 according to a third embodiment.
Figure 9B:
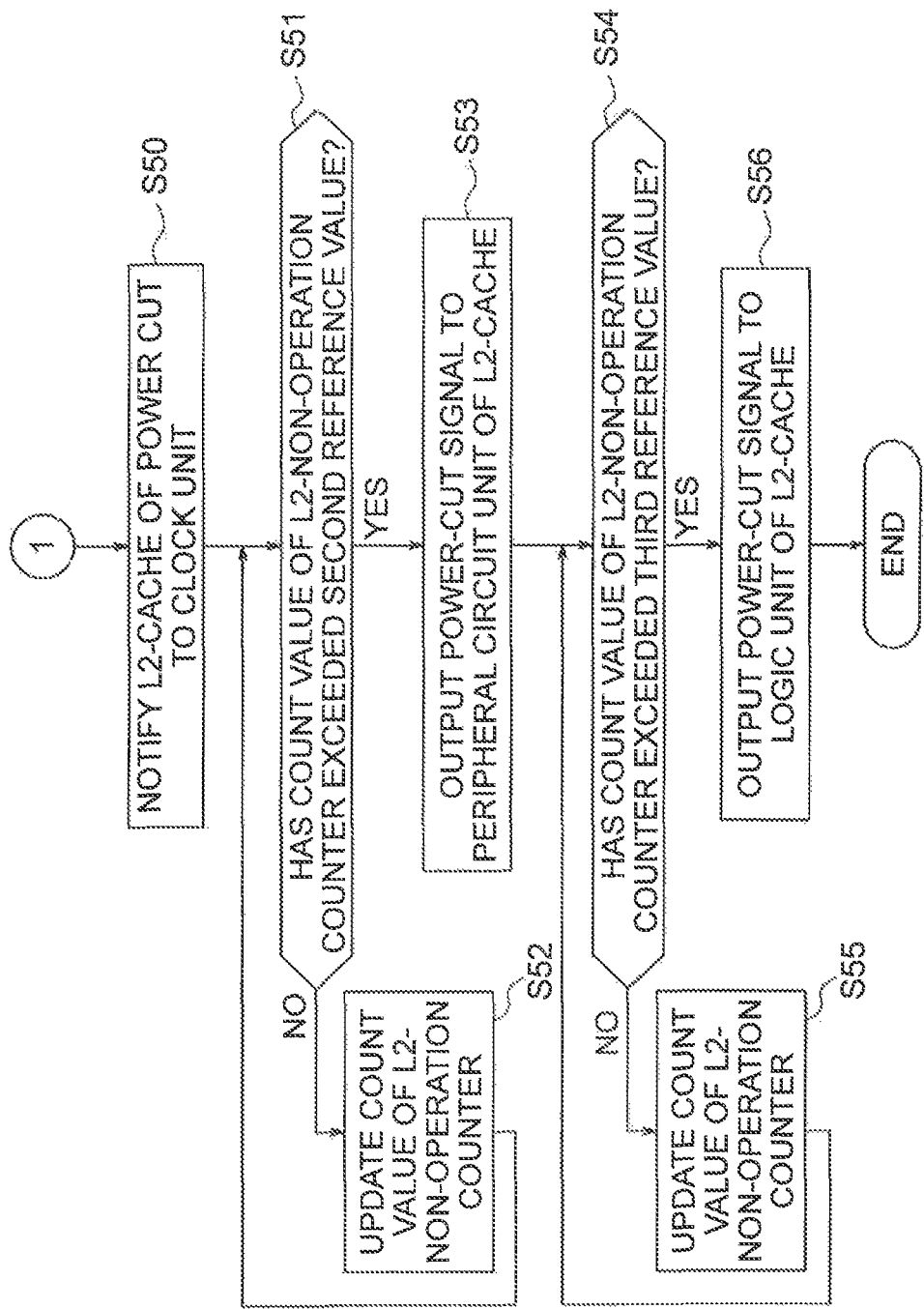
FIG. 9B is a flowchart following to the flowchart of FIG. 9A.

FIGS. 9A and 9B are flowcharts showing an operation of a power-supply controller 10 according to the third embodiment. In steps S41 to S46, like steps S21 to S26 in FIG. 7, it is determined whether the count value of the L2-non-operation counter has exceeded a first reference value (step S45). If the count value of the L2-non-operation counter has exceeded the first reference value, the power-supply controller 10 notifies the L2-cache 7 to cut off the power supply to a clock unit (clock circuitry) of the L2-cache 7 (step S47).

As described above, according to the third embodiment, the L2-cache 7 is divided into three units of the clock unit, the peripheral circuitry and the logic unit, and power supply to the clock unit is cut off firstly. The clock unit is a buffer, a flip-flop, etc. that generates a clock signal to be used by the L2-cache 7.

The first reference value in step S45 is set to, for example, a lower value than the first reference value in step S25. With this lower reference value, it is possible to accelerate a timing of notifying the power-cut-off to the L2 cache 7, compared with the second embodiment.

Steps S48 to S56 are similar to step S23 and the following steps in FIG. 7. If the count value of the L2-non-operation counter has exceeded a second reference value (YES in step S51), the power-supply controller 10 instructs power cut-off to the peripheral circuitry of the L2-cache 7 (step S52). In addition, if the count value of the L2-non-operation counter has exceeded a third reference value (YES in step S54), the power-supply controller 10 instructs power cut-off to the logic unit of the L2-cache 7 (step S56). The first to third reference values have a relationship of, for example, the first reference value<the second reference value<the third reference value.

In the flowcharts of FIGS. 9A and 9B, steps S45, S51 and S541 correspond to the request determination unit.

FIG. 10A and FIG. 10B are drawings showing the correspondence between operation conditions and power cut-off units of a processor 2 according to the third embodiment. When FIG. 10A and FIG. 10B are compared with FIG. 8A and FIG. 8B, an H3-state is newly added. In the H1-state that follows the C0-state, power supply to the clock unit of the L2-cache 7 is cut off. In the H2-state that follows the H1-state, power supply to the peripheral circuitry of the L2-cache 7 is cut off. In the H3-state that follows the H2-state, power supply to the entire L2-cache 7 is cut off, including the logic unit. The circuit segments to be cut off from power supply in the following C1- to C4-states are the same as those shown in FIGS. 6 and 8.

As described above, according to the third embodiment, the L2-cache 7 is divided into three units of the clock unit, the peripheral circuitry and the logic unit which are cut off from power supply at different timings. Therefore, power cut-off to the L2-cache 7 can be controlled more finely than the second embodiment, and hence power consumption can be more reduced.

In the third embodiment described above, one example has been explained in which power-cut-off control is performed by dividing the L2 cache 7 into three units of the clock unit, the peripheral circuitry and the logic unit. Even in a higher level cache memory of a non-volatile memory than the L2 cache 2, the power-cut-off control may be performed at different timings in the clock unit, the peripheral circuitry and the logic unit obtained by dividing each cache memory in accordance with the same process as that shown in FIG. 7.

Fourth Embodiment

In the first to third embodiments described above, the read request counter 9 embedded in the memory control circuit 1 counts the number of times of read requests from the L1-cache 6 to the L2-cache 7 and the responses to the read requests. By contrast, in a fourth embodiment which will be described below, an operation-condition monitoring unit (operation-condition monitoring circuitry) is embedded in the L2-cache 7, instead of the read request counter 9.

Figure 11:
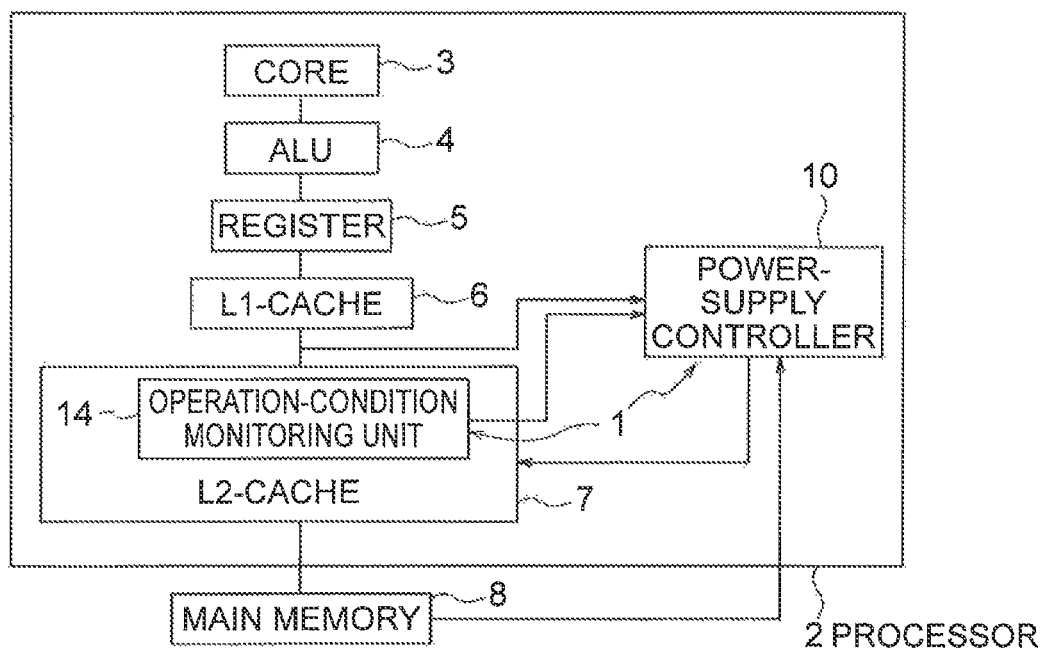
FIG. 11 is a block diagram schematically showing schematic configuration of a processor 2 according to a fourth embodiment.

FIG. 11 is a block diagram schematically showing configuration of a processor 2 according to the fourth embodiment. Compared with FIG. 1, the processor 2 of FIG. 11 is provided with an operation-condition monitoring unit 14 in the L2-cache 7, instead of the read request counter 9.

The operation-condition monitoring unit 14 monitors whether there are a read request to the L2-cache 7, a response to the read request, and read and write requests to cache memories of higher level than the L2-cache 7. The read request counter 9 described in the first to third embodiments counts only the number of times of the read requests from the L1-cache 6 and the responses to the read requests. In contrast, the operation-condition monitoring unit 14 monitors read and write requests to cache memories of higher level than the L2-cache 7, not only from the L1-cache 6.

Figure 12:
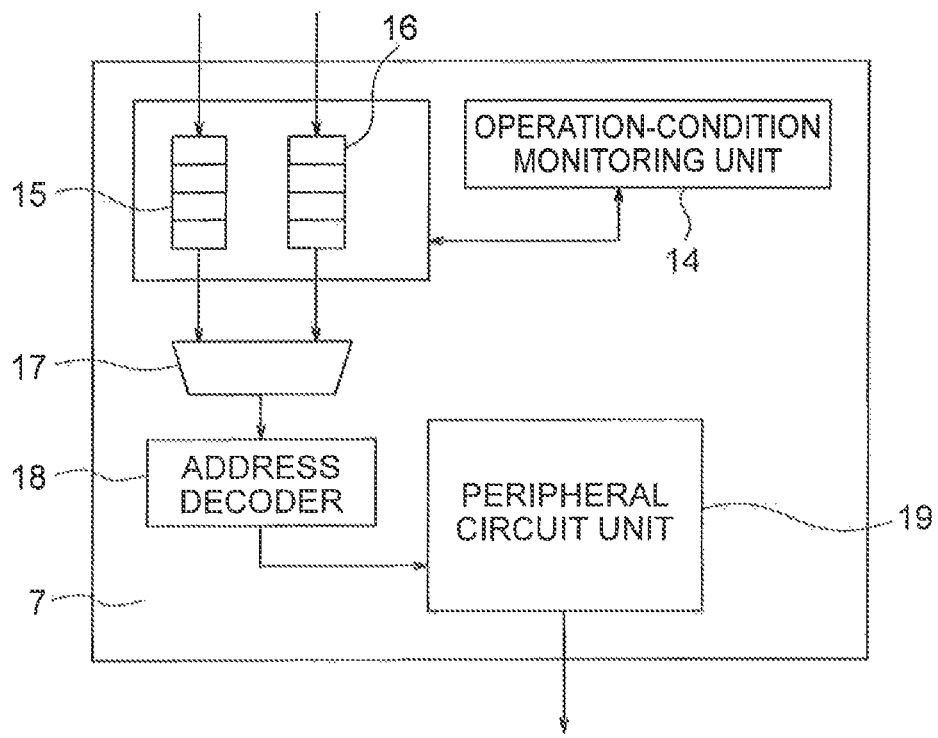
FIG. 12 is a block diagram showing the internal configuration of the main part of an L2-cache 7 according to the fourth embodiment.

FIG. 12 is a block diagram showing the internal configuration of the main part of an L2-cache 7 according to the fourth embodiment. The L2-cache 7 of FIG. 12 has the operation-condition monitoring unit 14, a write buffer 15 that stores a write waiting job to the L2-cache 7, a read buffer 16 that stores a read waiting job from the L2-cache 7, a selector 17 that selects either the output of the write buffer 15 or the output of the read buffer 16, an address decoder 18 that decodes the output of the selector 17, and a peripheral circuitry 19 of the sub-array 11 shown in FIG. 3.

Based on the write waiting job stored in the write buffer 15 and the read waiting job stored in the read buffer 16, the operation-condition monitoring unit 14 monitors whether there are remaining jobs to be written in and read from the L2-cache 7.

More specifically, the operation-condition monitoring unit 14 has an embedded first no-job counter (not shown). The first no-job counter starts a counting operation at a moment of no write waiting jobs being stored in the write buffer 15 and no read waiting jobs being stored in the read buffer 16, and measures the length of a period in which the L2-cache 7 does not have any write and read waiting jobs.

Figure 13:
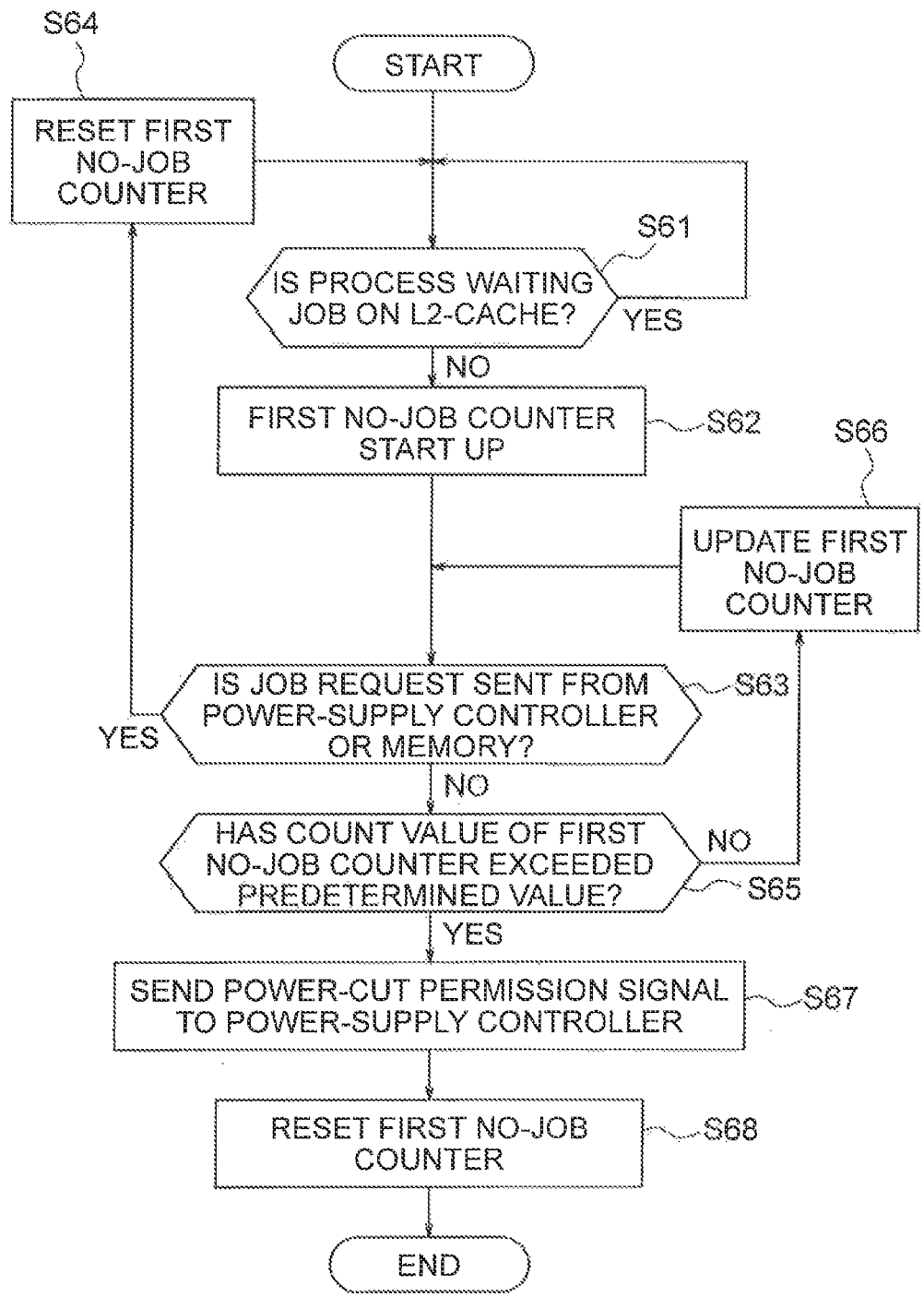
FIG. 13 is a flowchart showing an operation of an operation-condition monitoring unit 14 according to the fourth embodiment.

FIG. 13 is a flowchart showing an operation of the operation-condition monitoring unit 14 according to the fourth embodiment. It is determined whether there is a process waiting job on the L2-cache 7 (step S61). In this step, it is determined whether there are process waiting jobs stored in the write buffer 15 and the read buffer 16.

If there are process waiting jobs, the operation remains in step S61. If there is no process waiting job, the operation-condition monitoring unit 14 starts up the first no-job counter (step S62). After the stat-up, the first no-job counter counts up cyclically, for example, in synchronism with a system clock of the processor 2.

Next, it is determined whether there is a job request from the power-supply controller 10, another cache memory or the main memory 8 (step S63). If it is determined in step S63 that there is an incoming job request, the operation-condition monitoring unit 14 resets the first no-job counter (step S64) and then executes the processes of step S61 and the following steps.

If it is determined in step S63 that there is no incoming job request, it is determined whether the count value of the first no-job counter has exceeded a predetermined value (step S65). If the count value of the first no-job counter has not exceeded the predetermined value, the first no-job counter continues a count operation (step S66) and the operation returns to step S63.

If it is determined in step S65 that the count value of the first no-job counter has exceeded the predetermined value, the operation-condition monitoring unit 14 sends a power-cut-off permission signal for the L2-cache 7 to the power-supply controller 10 (step S67). Thereafter, the operation-condition monitoring unit 14 resets the first no-job counter (step S68). In the flowchart of FIG. 13, step S65 corresponds to the request determination unit.

Figure 14:
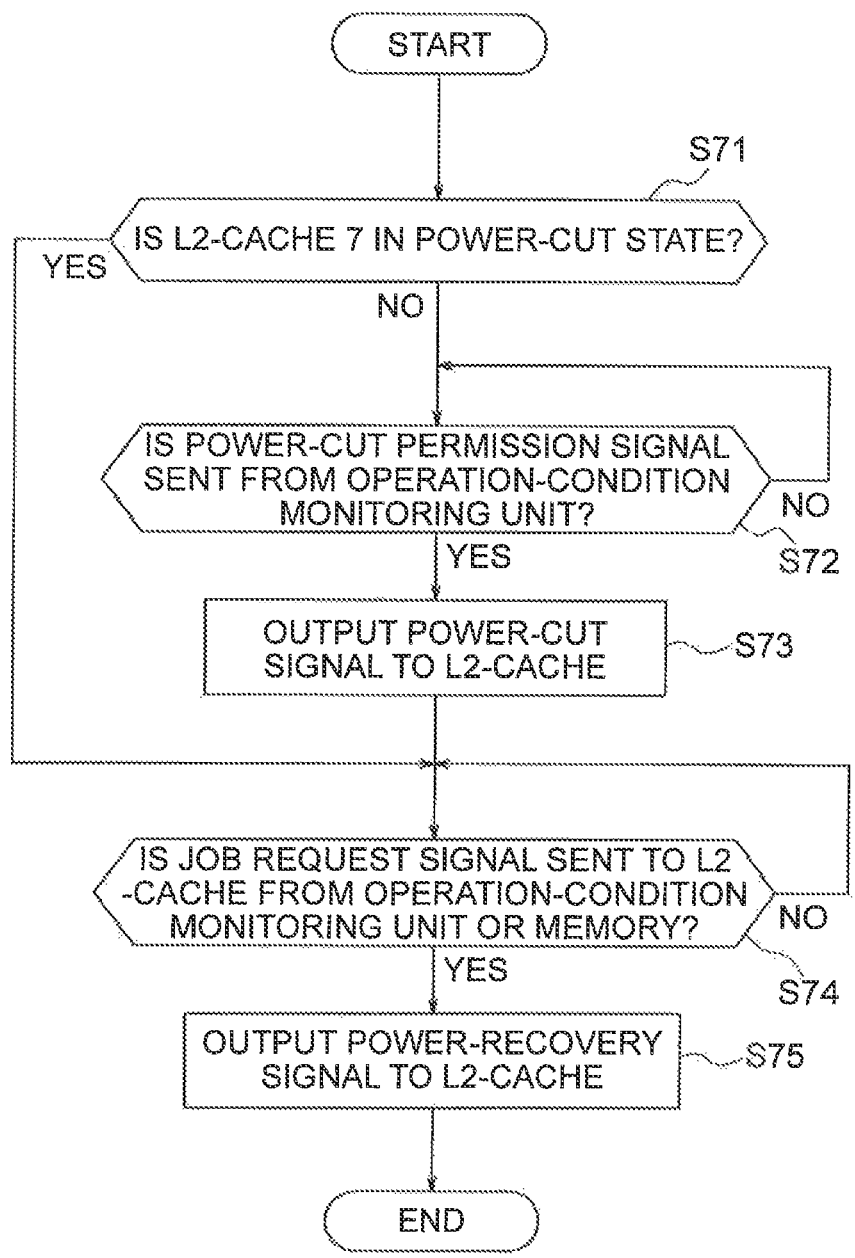
FIG. 14 is a flowchart showing an operation of a power-supply controller 10 according to the fourth embodiment.

FIG. 14 is a flowchart showing an operation of the power-supply controller 10 according to the fourth embodiment. It is determined whether the L2-cache 7 is in a power-cut-off state (step S71). If not the power-cut-off state, it is determined whether a power-cut-off permission signal is sent from the operation-condition monitoring unit 14 (step S72). The operation remains in step S72 until there is an incoming power-cut-off permission signal. When the power-cut-off permission signal is sent, the power-supply controller 10 instructs the L2-cache 7 to cut off power supply (step S73).

If it is determined in step S71 that the L2-cache 7 is in the power-cut-off state, or step S73 is complete, it is determined whether there is a job request sent from the operation-condition monitoring unit 14, another cache memory or the main memory 8 (step S74). The operation remains in step S74 until there is an incoming job request. When the job request is sent, the power-supply controller 10 performs a process of power recovery to the L2-cache 7 (step S75).

As described above, according to the fourth embodiment, the operation-condition monitoring unit 14 embedded in the L2-cache 7 monitors whether there are process waiting jobs in the write buffer 15 and the read buffer 16 in the L2-cache 7. Specifically, the operation-condition monitoring unit 14 determines whether a state of no process waiting jobs in the L2-cache 7 has continued for a specific period of time or longer by means of the count value of the first no-job counter. Accordingly, when the state of no process waiting jobs in the L2-cache 7 has continued for the specific period of time or longer, power supply to the L2-cache 7 can be cut off. In the first to third embodiments, the read request counter 9 counts the number of times of the read requests from the L1-cache 6 to the L2-cache 7 and the responses to the read requests, thereby controlling the power cut-off timing to the L2-cache 7. In contrast, the operation-condition monitoring unit 14 in the present embodiment monitors whether there are job requests to the L2-cache 7 from another cache memory or the main memory 8, not only from the L1-cache 6, depending on the contents of the write buffer 15 and the read buffer 16. Therefore, whether the L2-cache 7 has received any job request or not can be determined more reliably than the first to third embodiments.

Fifth Embodiment

In the fourth embodiment described above, power supply is cut off to the entire L2-cache 7. By contrast, in a fifth embodiment which will be explained below, like the second embodiment, the L2-cache 7 is divided into the peripheral circuitry and the logic unit to which power supply is cut off in stages at different timings. The explanation of the internal configuration of a processor 2 according to the firth embodiment will be omitted because it is the same as the fourth embodiment.

Figure 15:
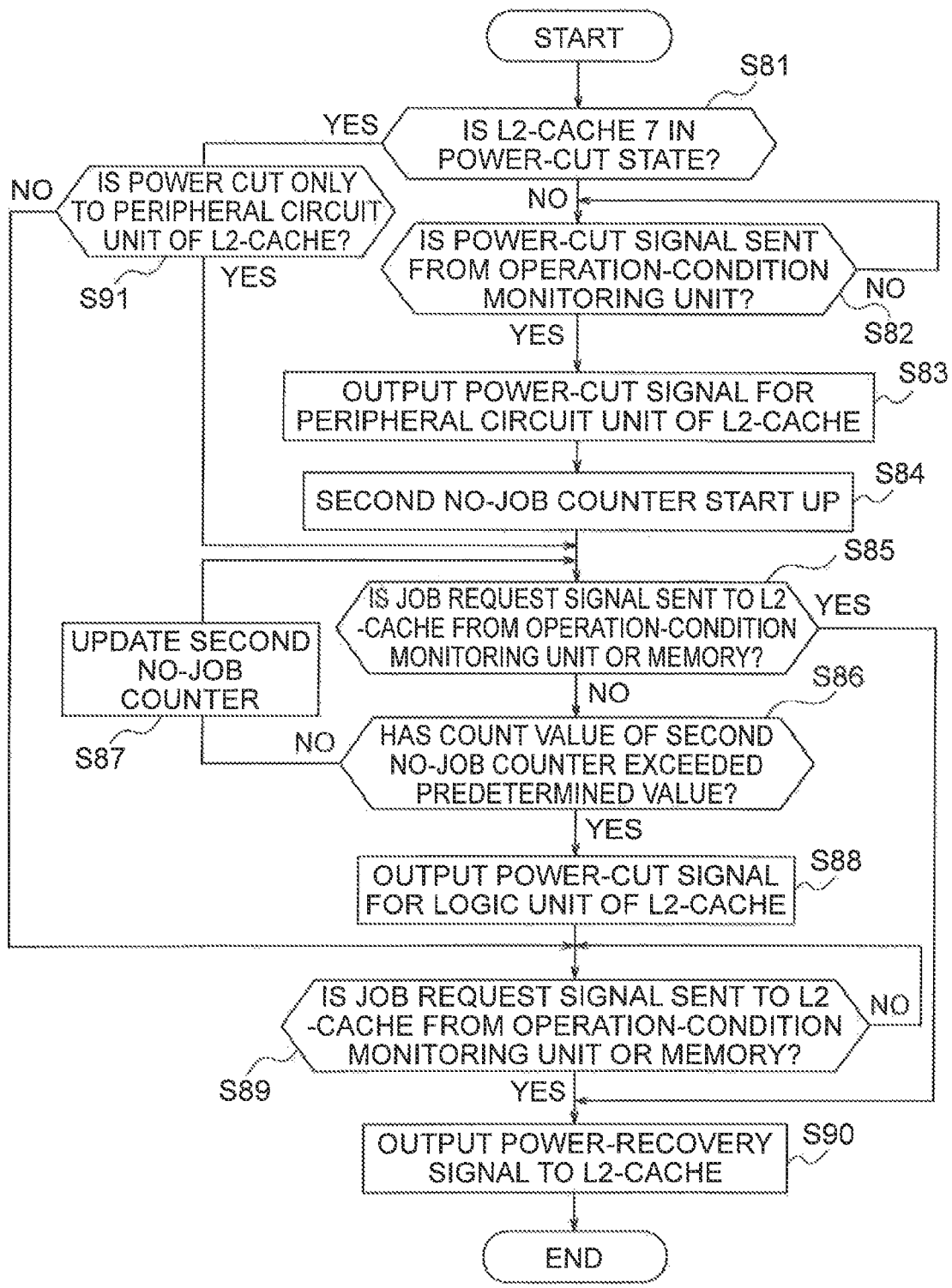
FIG. 15 is a flowchart showing an operation of a power-supply controller 10 according to a fifth embodiment.

FIG. 15 is a flowchart showing an operation of a power-supply controller 10 according to the fifth embodiment. It is determined whether the L2-cache 7 is in a power-cut-off state or not (step S81). If not the power-cut-off state, it is determined whether a power-cut-off signal is sent from the operation-condition monitoring unit 14 (step S82). The operation remains in step S82 until there is an incoming power-cut-off signal.

When the power-cut-off signal is sent from the operation-condition monitoring unit 14, the power-supply controller 10 instructs the L2-cache 7 to cut off power supply to the peripheral circuitry of the L2-cache 7 (step S83) and starts up the second no-job counter (step S84). The second no-job counter is embedded in the power-supply controller 10 and used for determining whether a period in which there is no job request to the L2-cache 7 after power supply to a part of the elements in the L2-cache 7 has been cut off for a specific period of time or longer. When starting up, the second no-job counter counts up cyclically, for example, in synchronism with a system clock of the processor 2.

Next, it is determined whether there is a job request to the L2-cache 7 from the operation-condition monitoring unit 14, another cache memory or the main memory 8 (step S85). If there is no job request, it is determined whether the count value of the second no-job counter has exceeded a predetermined value (step S86). If the count value has not exceeded the predetermined value, the second no-job counter has continued a count operation (step S87) and the operation returns to step S86. If the count value has exceeded the predetermined value, the power-supply controller 10 instructs the L2-cache 7 to cut off power supply to the logic unit of the power cut-off (step S88).

Next, it is determined whether there is a job request to the L2-cache 7 from the operation-condition monitoring unit 14, another cache memory or the main memory 8 (step S89). The operation remains in step S89 until there is a job request. When there is a job request, the power-supply controller 10 instructs the L2-cache 7 to recover power supply (step S90).

If it is determined in step S81 that the L2-cache 7 is in the power-cut-off state, it is determined whether power supply is cut off only to the peripheral circuitry of the L2-cache 7 (step S91). If YES in step S91, step S85 is executed whereas, if NO in step S91, step S89 is executed.

In the flowchart of FIG. 15, steps S82 and S86 correspond to the request determination unit.

As described above, in the fifth embodiment, the operation-condition monitoring unit 14 embedded in the L2-cache 7 monitors whether there are process waiting jobs in the L2-cache 7. Based on the monitoring results, it is possible to cut off the power supply to the peripheral circuitry and the logic unit obtained by dividing the L2 cache 7 in stages.

Sixth Embodiment

In a sixth embodiment which will be explained below, the L2-cache 7 is divided into three units to cut off the power supply in stages.

Figure 16A:
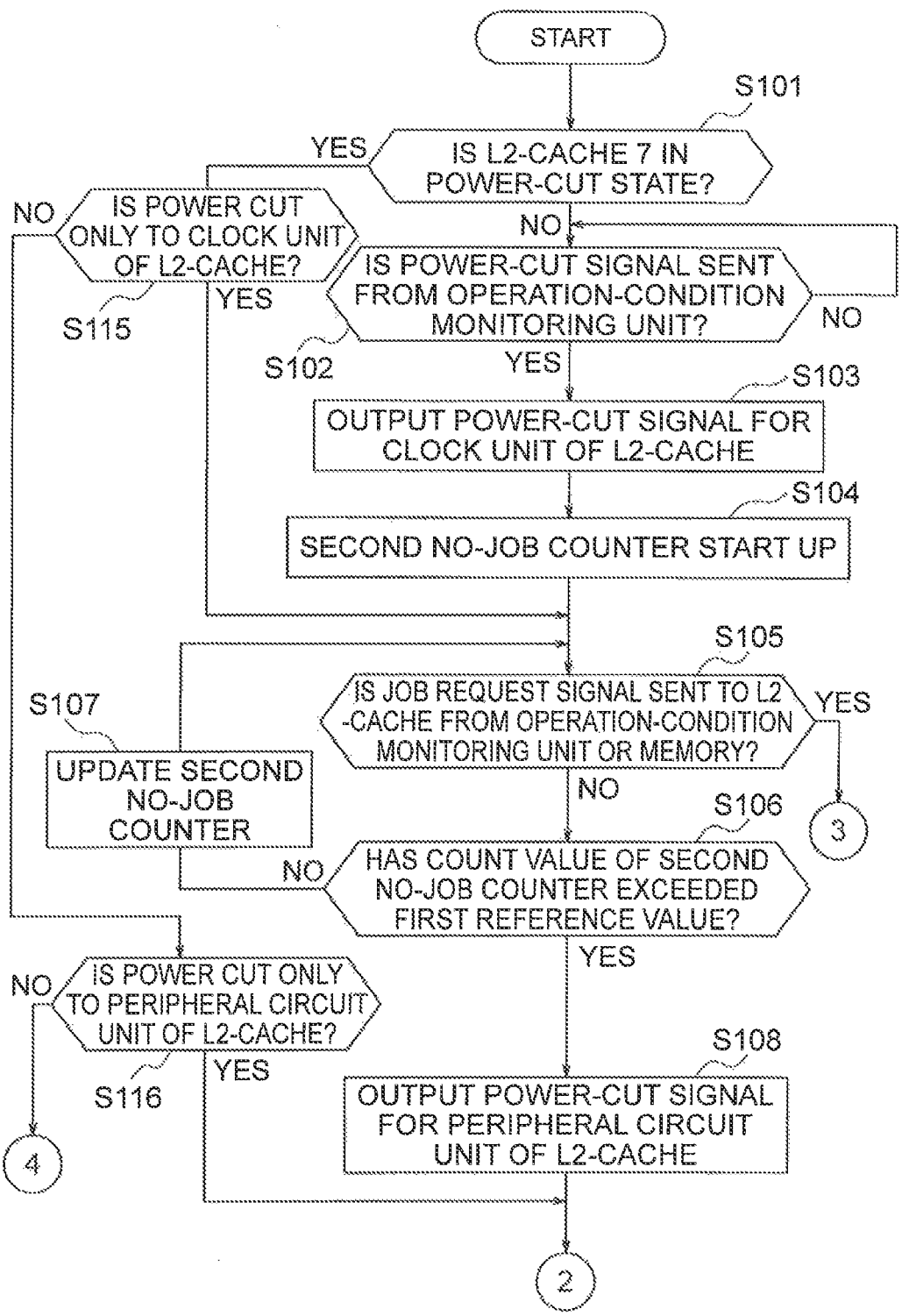
FIG. 16A is a flowchart showing an operation of a power-supply controller 10 according to a sixth embodiment.
Figure 16B:
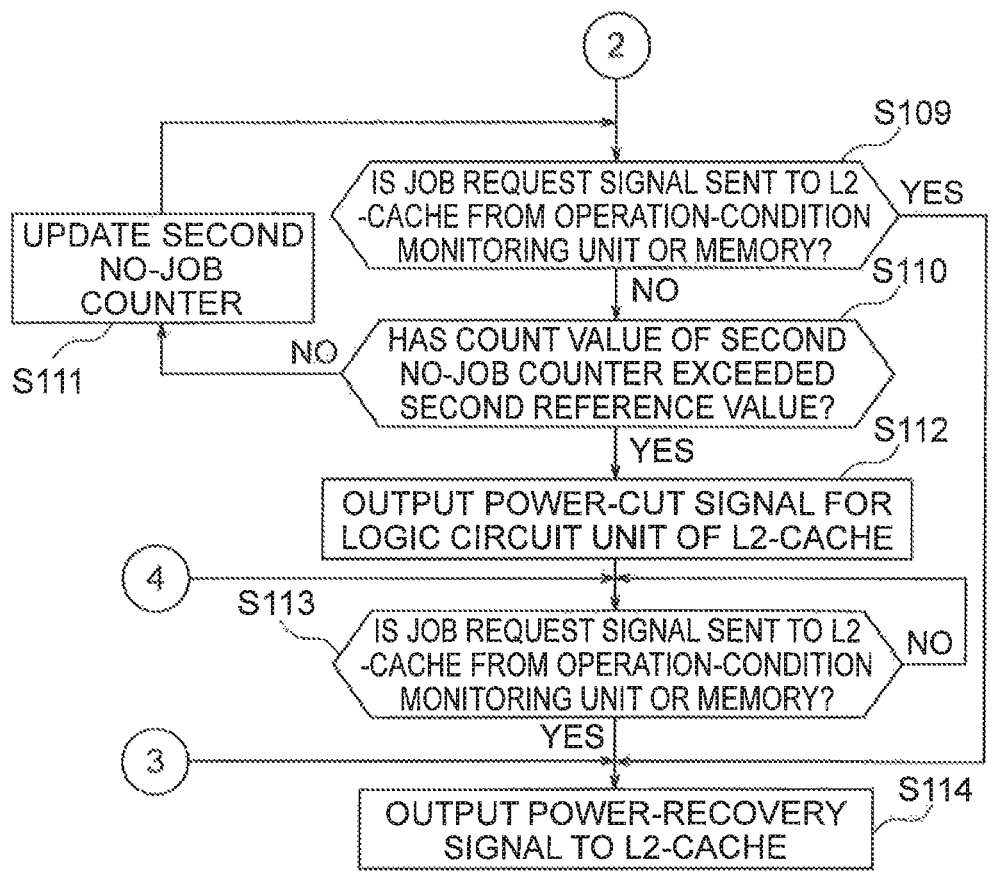
FIG. 16B is a flowchart following to the flowchart of FIG. 16A.

FIGS. 16A and 16B are flowcharts showing an operation of a power-supply controller 10 according to the sixth embodiment. It is determined whether the L2-cache 7 is in a power-cut-off state or not (step S101). If not the power-cut-off state, it is determined whether a power-cut-off signal is sent from the operation-condition monitoring unit 14 (step S102). The operation remains in step S102 until there is an incoming power-cut-off signal. When the power-cut-off signal is sent, the power-supply controller 10 instructs the L2-cache 7 to cut off power supply to the clock unit of the L2-cache 7 (step S103) and starts up the second no-job counter (step S104).

Next, it is determined whether there is any job request to the L2-cache 7 from another cache memory or the main memory 8 (step S105). If there is no job request, it is determined whether the count value of the second no-job counter has exceeded the first reference value (step S106). If the count value has not exceeded the first reference value, the second no-job counter continues the count-up operation (step S107), and the operation returns to S105.

If it is determined in step S106 that the count value of the second no-job counter has exceeded the first reference value, the power-supply controller 10 instructs the L2-cache 7 to cut off power supply to the peripheral circuitry of the L2-cache 7 (step S108).

Next, it is determined whether there is any job request to the L2-cache 7 from another cache memory or the main memory 8 (step S109). If it is determined in step S109 that there is no job request, it is determined whether the count value of the second no-job counter has exceeded the second reference value (step S110). If the count value has not exceeded the second reference value, the second no-job counter continues the count-up operation (step S111), and the operation returns to S109.

If it is determined in step S110 that the count value of the second no-job counter has exceeded the second reference value, the power-supply controller 10 instructs the L2-cache 7 to cut off the power supply to the logic unit of the L2-cache 7 (step S112).

Next, it is determined whether there is any job request to the L2-cache 7 from another cache memory or the main memory 8 (step S113). The operation remains in step S113 until there is a job request. If there is a job request, the power-supply controller 10 instructs the L2-cache 7 to recover power (step S114).

If it is determined in step S101 that the L2-cache 7 is in the power-cut-off state, it is determined whether the power supply only to the clock unit of the L2 cache 7 is being cut off (step S115). If YES in S115, the operation moves to step S105, whereas, if NO in S115, it is determined whether the power supply only to the peripheral circuitry of the L2 cache 7 is being cut off (step S116). If YES in S116, the operation moves to step S109, whereas, if NO in 5116, the operation moves to step S113.

In the flowchart of FIGS. 16A and 16B, steps S102, S106 and S110 correspond to the request determination unit.

As described above, according to the sixth embodiment, the operation-condition monitoring unit 14 embedded in the L2-cache 7 monitors whether there are process waiting jobs in the L2-cache 7. Based on the monitoring results, it is possible to cut off the power supply to the clock unit, the peripheral circuitry and the logic unit obtained by dividing the L2 cache 7 in stages.

Each of the above embodiments is explained with an example in which the memory cells of the L2-cache 7 are MRAM cells. However, the memory cells may be of other non-volatile memories (for example, NAND flash memory cells or STT-MRAM cells). Moreover, in each of the above-described embodiments, a part of the memory control circuit 1 or the entire memory control circuit 1 may be embedded in the L1-cache 6 or L2-cache 7. Furthermore, in each of the above-described embodiments, when power supply is cut off to an i-th memory (i being an integer of 1 or more and of n or less, n being an integer of 2 or more) level cache memory among first to n-th level cache memories, a part of or all of the power-cut-off allowable memories may be cut off entirely from power supply. Or power cut-off timing may be controlled for each non-volatile memory of the first to n-th-level cache memories including the i-th memory.

At least part of the memory control circuit 1 and the processor 2 explained in the above embodiments may be configured with hardware or software. When it is configured with software, a program that performs at least part of the functions of the memory control circuit 1 and the processor 2 may be stored in a storage medium such as a flexible disk and CD-ROM, and then installed in a computer to run thereon. The storage medium may not be limited to a detachable one such as a magnetic disk and an optical disk but may be a standalone type such as a hard disk drive and a memory.

Moreover, a program that achieves the function of at least part of the memory control circuit 1 and the processor 2 may be distributed via a communication network (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory control circuit comprising:
   a request determination circuitry to determine whether a period without read-out request and write request to an i-th (i being an integer of 1 or more and of n or less, n being an integer of 2 or more) level cache memory among first to n-th level cache memories continues for a first period of time or longer, the i-th level cache memory comprising a first non-volatile memory; and
   a power-supply controller to control a power cut-off timing to the i-th level cache memory based on a determination of the request determination circuitry.

2. The memory control circuit of claim 1, wherein the power-supply controller controls a power cut-off timing to the first non-volatile memory, irrespective of a power management process by an operating system.

3. The memory control circuit of claim 1, wherein, when the power-supply controller cuts off power supply to the i-th level cache memory, the power-supply controller cuts off power supply to the memory capable of cutting off the power supply, among a main memory and the cache memories except for the i-th level cache memory.

4. The memory control circuit of claim 1, wherein at least one of the cache memories other than the i-th level cache memory comprises a second non-volatile memory, and the power-supply controller controls a power cut-off timing to each of the first and second non-volatile memories.

5. The memory control circuit of claim 1, further comprising a read request counter to count up when there is a read request from a low-level memory that is one level lower than the i-th level cache memory to the i-th level cache memory and count down when the i-th level cache memory sends data to the low-level memory in accordance with the request,
   wherein the request determination circuitry determines whether to cut off power supply to the i-th level cache memory, according to a count value of the read request counter.

6. The memory control circuit of claim 5, wherein the request determination circuitry instructs the power-supply controller to cut off power supply to the i-th level cache memory when a period in which the count value of the read request counter is a predetermined value continues for the first period of time or longer.

7. The memory control circuit of claim 1, wherein the request determination circuitry comprises an operation-condition monitoring circuitry to determine whether a period in which there are no write and read waiting jobs to the i-th level cache memory exceeds a second period of time,
   wherein the power-supply controller controls a power cut-off timing to the i-th level cache memory based on a determination of the operation-condition monitoring circuitry.

8. The memory control circuit of claim 7, wherein the i-th level cache memory comprises a write buffer to store write waiting jobs and a read buffer to store read waiting jobs,
   wherein the operation-condition monitoring circuitry determines that there are no write waiting jobs and read waiting jobs when the write buffer and the read buffer are empty.

9. The memory control circuit of claim 1, wherein the power-supply controller divides the i-th level cache memory into a plurality of circuit blocks and cuts off power supply to each of the circuit blocks at different timings.

10. The memory control circuit of claim 9, wherein at least two circuit blocks among the plurality of circuit blocks are a peripheral circuitry around a memory cell array in the i-th level cache memory and a logic circuitry different from the peripheral circuitry,
    wherein the power-supply controller cuts off power supply to the peripheral circuitry and then cuts off power supply to the logic circuitry, in accordance with a determination of the request determination circuitry.

11. The memory control circuit of claim 10, wherein the plurality of circuit blocks comprise a clock circuitry that generates a clock signal to be used by the i-th level cache memory,
    wherein the power-supply controller cuts off power supply to the clock circuitry and then the peripheral circuitry, and then further the logic circuitry, in accordance with the determination of the request determination circuitry.

12. The memory control circuit of claim 1, wherein the first non-volatile memory is an MRAM (Magnetoresistive Random Access Memory).

13. A processor comprising:
    a processor core; and
    a memory control circuit to control an access to a cache memory in accordance with instruction from the processor core,
    wherein the memory control circuit comprises:
    a request determination circuitry to determine whether a period without read-out request and write request to an i-th (i being an integer of 1 or more and of n or less, n being an integer of 2 or more) level cache memory among first to nth level cache memories continues for a first period of time or longer, the i-th level cache memory comprising a first non-volatile memory; and
    a power-supply controller to control a power cut-off timing to the i-th level cache memory based on a determination of the request determination circuitry.

14. The processor of claim 13, wherein the power-supply controller controls a power cut-off timing to the first non-volatile memory, irrespective of a power management process by an operating system.

15. The processor of claim 13, wherein, when the power-supply controller cuts off power supply to the i-th level cache memory, the power-supply controller cuts off power supply to the memory capable of cutting off the power supply, among a main memory and the cache memories except for the i-th level cache memory.

16. The processor of claim 13, wherein at least one of the cache memories other than the i-th level cache memory comprises a second non-volatile memory, and the power-supply controller controls a power cut-off timing to each of the first and second non-volatile memories.

17. The processor of claim 13, further comprising a read request counter to count up when there is a read request from a low-level memory that is one level lower than the i-th level cache memory to the i-th level cache memory and count down when the i-th level cache memory sends data to the low-level memory in accordance with the request,
    wherein the request determination circuitry determines whether to cut off power supply to the i-th level cache memory, according to a count value of the read request counter.

18. The processor of claim 17, wherein the request determination circuitry instructs the power-supply controller to cut off power supply to the i-th level cache memory when a period in which the count value of the read request counter is a predetermined value continues for the first period of time or longer.

19. The processor of claim 13, wherein the request determination circuitry comprises an operation-condition monitoring circuitry to determine whether a period in which there are no write and read waiting jobs to the i-th level cache memory exceeds a second period of time,
    wherein the power-supply controller controls a power cut-off timing to the i-th level cache memory based on a determination of the operation-condition monitoring circuitry.

20. The processor of claim 19, wherein the i-th level cache memory comprises a write buffer to store write waiting jobs and a read buffer to store read waiting jobs,
    wherein the operation-condition monitoring circuitry determines that there are no write waiting jobs and read waiting jobs when the write buffer and the read buffer are empty.

\* \* \* \* \*